(12) United States Patent
Avraham et al.

(10) Patent No.: US 11,177,012 B1
(45) Date of Patent: Nov. 16, 2021

(54) FAST COPY THROUGH CONTROLLER

(71) Applicant: Western Digital Technologies, Inc., San Jose, CA (US)

(72) Inventors: Dudy David Avraham, Even Yehuda (IL); Ran Zamir, Ramat Gan (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/910,905

(22) Filed: Jun. 24, 2020

(51) Int. Cl.
| | |
|---|---|
| G11C 29/02 | (2006.01) |
| G11C 29/42 | (2006.01) |
| H03M 13/23 | (2006.01) |
| H03M 13/29 | (2006.01) |

(52) U.S. Cl.
CPC ............ *G11C 29/024* (2013.01); *G11C 29/42* (2013.01); *H03M 13/235* (2013.01); *H03M 13/29* (2013.01)

(58) Field of Classification Search
None
See application file for complete search history.

(56) References Cited

U.S. PATENT DOCUMENTS

| | | | | |
|---|---|---|---|---|
| 2011/0283166 | A1* | 11/2011 | Kim | G06F 11/106 714/773 |
| 2014/0310534 | A1* | 10/2014 | Gurgi | G06F 12/1408 713/193 |
| 2015/0349807 | A1* | 12/2015 | Vernon | H03M 13/6577 714/774 |
| 2018/0039541 | A1* | 2/2018 | Hahn | G06F 3/0619 |
| 2020/0241956 | A1* | 7/2020 | Son | G06F 12/0238 |

* cited by examiner

*Primary Examiner* — Guerrier Merant
(74) *Attorney, Agent, or Firm* — Patterson & Sheridan, LLP; Steven H. Versteeg

(57) ABSTRACT

A method and apparatus for a CTC data copy operation, in that modification, and subsequent encoding only affects a small portion of metadata associated with copied data. By modifying and re-encoding only this small portion of metadata, a small portion of the parity data for the copied data requires updating. In embodiments where there are no errors in the read data to be copied (e.g., from an SLC portion of a NAND), decoding, modification, and encoding, may be done in parallel. Because such a small number of metadata bits are modified, in some embodiments, all possible codewords for the parity bits may be predetermined and combined (e.g., by XOR) to update the metadata parity bits.

20 Claims, 8 Drawing Sheets

FAST COPY THROUGH CONTROLLER

BACKGROUND OF THE DISCLOSURE

Field of the Disclosure

Embodiments of the present disclosure generally relate to copying data within a NAND array, and more particularly, to encoding copied data.

Description of the Related Art

In a solid-state drive (SSD), copying data from one location to another is a common operation for data folding, garbage collection, read scrubs, and similar operations. To carry out copying, an SSD typically employs either on-chip copy, copying from one place in a NAND to another without going through the controller, or copy through controller (CTC), in which the data is copied to an SSD controller and written to the new location.

In CTC, data is typically decoded, edited, re-encoded, and then copied back to a NAND. CTC is a complex and expensive (i.e., in terms of time and power) operation. For many CTC operations, host data being copied remains unedited; only metadata associated with the host data being copied is modified. However, in prior approaches, even though only a small portion of the total data is being manipulated, all of the data (i.e., host data and metadata) is decoded and re-encoded, with the only benefit being the moving of the data. Because so little data is being usefully re-encoded (i.e., metadata), decoding and re-encoding all of the data wastes valuable time and processing resources that could be used for more valuable operations.

What is needed are systems and methods to address the shortcomings of prior approaches, such as to more efficiently decode and encode data in a manner that uses less time and power than the prior approaches.

SUMMARY OF THE DISCLOSURE

The present disclosure generally relates to methods and systems for a CTC data copy operation in that the modification and subsequent encoding only affects a small portion of metadata associated with copied data. By modifying and re-encoding only this small portion of metadata, a small portion of the parity data for the copied data requires updating. In embodiments where there are no errors in the read data to be copied (e.g., from an SLC portion of a NAND), decoding, modification, and encoding may be done in parallel. Because such a small number of metadata bits are modified, in some embodiments, all possible codewords for the parity bits may be predetermined and combined (e.g., by XOR) to update the metadata parity bits.

In one embodiment, a data storage device is disclosed, including one or more memory devices, and a controller configured to perform a method for encoding data. In embodiments, the method includes receiving data from the one or more memory devices, the data comprising parity check matrix data, and stored data, modifying a portion of the parity check matrix data corresponding to metadata associated with the data, and encoding the stored data with the modified parity-check matrix data.

In another embodiment, a controller for a data storage device is disclosed, including an I/O to one or more memory devices, and a processor configured to execute a method for encoding data. In embodiments the method includes receiving a request to move a portion of data, the portion of data comprising data and metadata comprising a first variable and a last variable, retrieving the portion of data, modifying the last variable, and writing the portion of data to the one or more memory devices.

In another embodiment, a system for storing data is disclosed, the system, including one or more memory means, and a controller means configured to carry out a method for encoding data. In embodiments, the method includes reading a section of data from the one or more memory means, wherein the section of data comprises metadata and data, the metadata comprising a beginning and an end, modifying a portion of the metadata contiguous with the end of the metadata, and writing the section of data to the one or more memory means.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

The present disclosure generally relates to systems and methods that, in a CTC data copy operation, modification, and subsequent encoding only affects a small portion of metadata associated with copied data. By modifying and re-encoding only this small portion of metadata, a small portion of the parity data for the copied data requires updating. In embodiments where there are no errors in the read data to be copied (e.g., from an SLC portion of a NAND), decoding, modification, and encoding may be done in parallel. Because such a small number of metadata bits are modified, in some embodiments, all possible codewords for the parity bits may be predetermined and combined (e.g., by XOR) to update the metadata parity bits.

Figure 1:
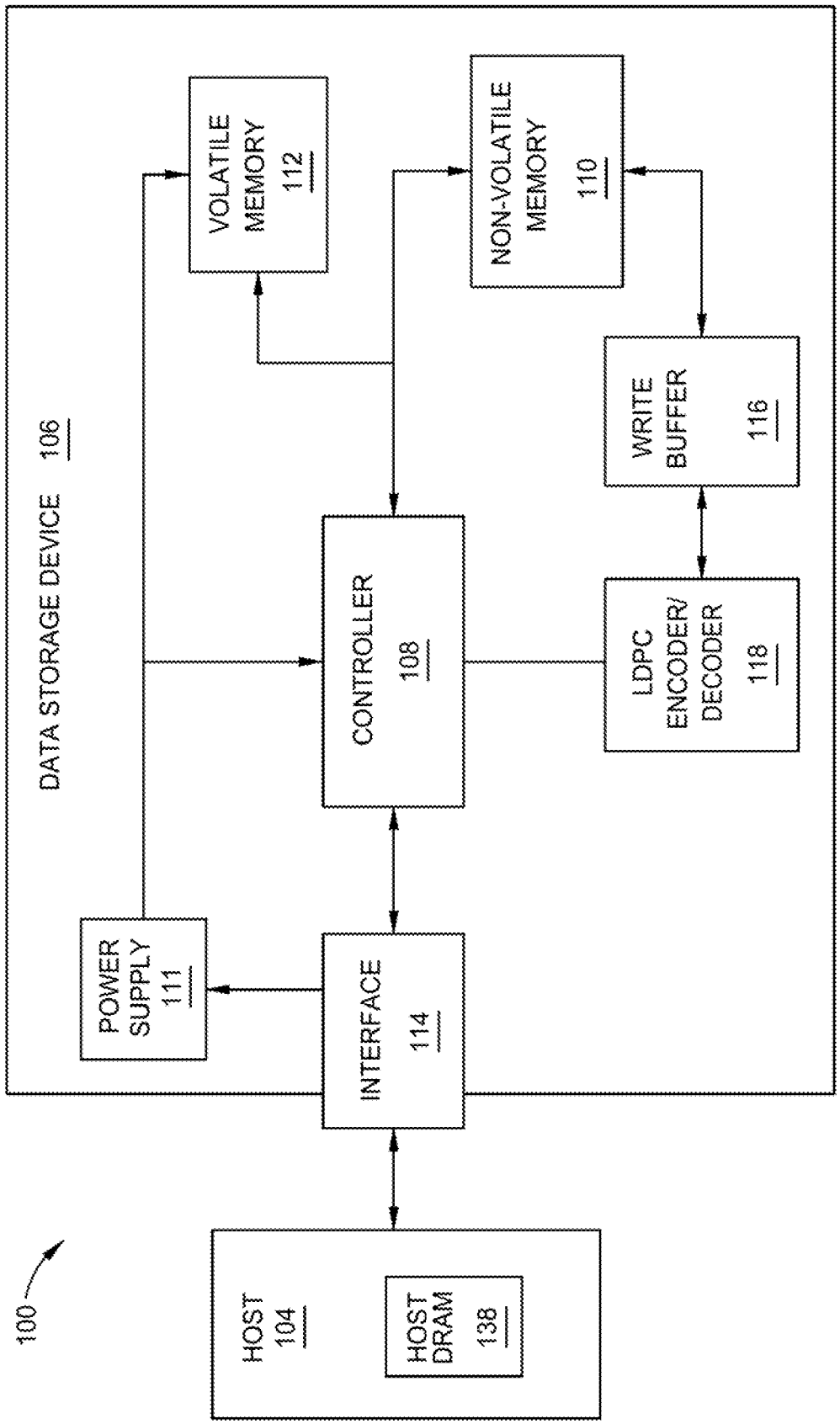
FIG. 1 depicts a schematic block diagram illustrating a storage system having a storage device that may function as a storage device for a host device, in accordance with one or more techniques of this disclosure.

FIG. 1 is a schematic block diagram illustrating a storage system 100 in which data storage device 106 may function as a storage device for a host device 104, in accordance with one or more techniques of this disclosure. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The storage system 100 includes a host device 104, which may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The data storage device 106 includes NVM 110, which may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. Flash memory devices may include NAND or NOR based flash memory devices and may store data based on a charge contained in a floating gate of a transistor for each flash memory cell. In NAND flash memory devices, the flash memory device may be divided into a plurality of blocks, which may be divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. Furthermore, NAND flash memory devices may be 2D or 3D devices and may be single level cell (SLC), multi-level cell (MLC), triple level cell (TLC), or quad level cell (QLC). The controller 108 may write data to and read data from NAND flash memory devices at the page level and erase data from NAND flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

The data storage device 106 includes a low-density parity code (LDPC) encoder 118 and an LDPC decoder 120. The LDPC encoder 118 and the LDPC decoder 120 may each include an internal memory to hold several matrices that include a plurality of error correction codes (ECC), where the internal memory of the LDPC encoder 118 and the LDPC decoder 120 are the same. The one or more matrices of the internal memory of the LDPC encoder 118 and the LDPC decoder 120 may allow for fast switching between matrices to avoid any firmware (FW) intervention or performance loss due to the time to switch between matrices. In the description herein, the LDPC encoder 118 may handle the encoding operations and the LDPC decoder 120 may handle the decoding operations.

Figure 2:
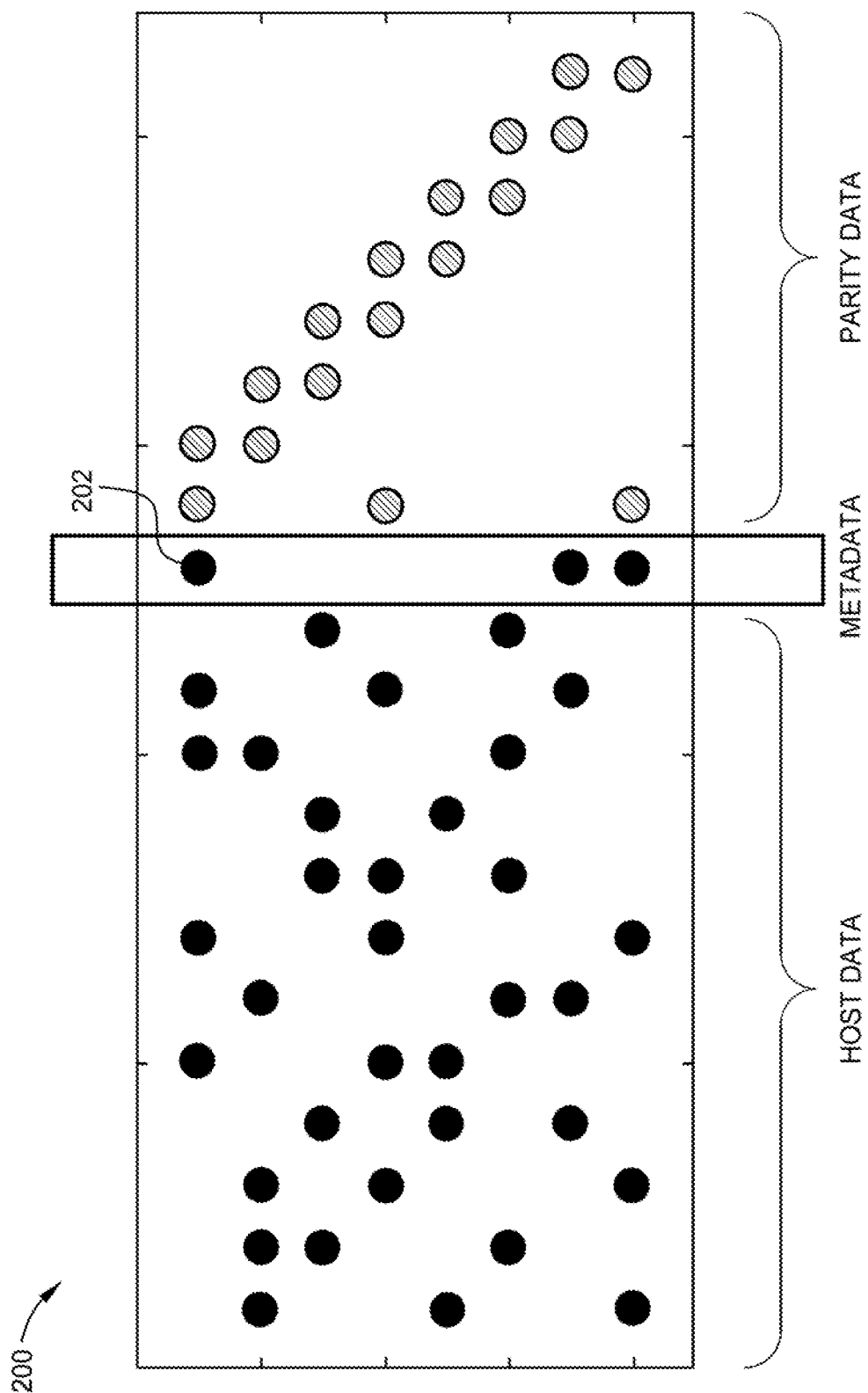
FIG. 2 depicts a graph illustrating the cascading effect of calculating parity bits for the metadata, according to disclosed embodiments.

FIG. 2 is a graph illustrating the cascading effect of calculating parity bits for the metadata, according to disclosed embodiments. Each dot represents a bit of data, such as host data (e.g., user data), metadata, and parity data. Host data may be any data from the host, such as the host 104 of FIG. 1, programmed to one or more flash management units (FMU) in the NVM, such as the NVM 110 of FIG. 1, of the data storage device, such as the data storage device 106 of FIG. 1. Each of the one or more FMUs may be about 4,096 B of physical memory. Each of the one or more FMUs may further be segmented into a logical block address (LBA), where each LBA may be about 512 B of physical memory. Furthermore, the flash translation layer (FTL) of the data storage device may logically store the physical location of each of the plurality of LBAs and/or each of the pluralities of FMU in order to easily access relevant memory locations in the data storage device. In some embodiments, the host data may be programmed to MRAM. The listed memory locations are not intended to be limiting, but to provide an example of a possible embodiment. Each FMU may also include metadata and parity data.

The controller generates metadata, such as firmware headers, scrambling seed, cyclic redundancy check (CRC), and FTL management information, for each FMU programmed to the NVM. In the description herein, the FMU may be described as a codeword for exemplary purposes. The metadata may be significantly less in size than the host data, such as about a few dozen bytes per four KB of host data. Furthermore, when the host data and metadata are transferred to the controller, such as the controller 108 of FIG. 1, the host data and the metadata may pass through a parity engine, such as an exclusive-OR (XOR) engine, to generate parity data. The parity data may be used to correct the associated failed codeword, where a failed codeword includes one or more bits of error. Parity data may be encoded utilizing a diagonal or a semi-diagonal parity check matrix, such as the diagonal parity check matrix illustrated in FIG. 2. In the diagonal or the semi-diagonal parity check matrix, each set of parity equations are dependent on the previous set of parity equations. For example, by changing a bit, such as the top bit 202, that is connected to the top variable, each subsequent parity bit is affected. Each affected parity bit is illustrated by the black outline of the bit. The listed matrix is not intended to be limiting, but to provide an example of a possible embodiment. In one embodiment, a first matrix or the H matrix may be utilized for decoding and a second matrix or the G matrix may be utilized for encoding. Because the H matrix is more sparse than the G matrix, the H matrix may be more feasible to manipulate. Therefore, the LDPC code may be designed to work on the H matrix on a column-by-column basis, such that the LDPC code may change the one or more of the columns starting with the last column of the H matrix, instead of making changes starting with the first column of the H matrix and all/most columns after the first column as in prior approaches. By only making changes starting with the last column of the H matrix, the change to the codeword may be minimal.

Common examples of flash management operations are folding, garbage collection, and memory scrubbing. The listed flash management operations are not intended to be limiting but to provide examples of possible embodiments. Folding may include writing data to the SLC memory, copying one or more SLC data to the controller, and programming the one or more SLC data to the MLC memory, the TLC memory, or the QLC memory. Garbage collection may include writing relevant data (e.g., current data) from a block of the NAND to the controller, de-allocating the relevant block, and programming the relevant data to another block of the NAND. Garbage collection may free up space in the NAND that is utilized by outdated data and regain usable memory space. Memory scrubbing may include decoding data from a block of the NAND at the controller, correcting any bit errors of the decoded data utilizing error correction codes (ECC), encoding the corrected data, and programming the encoded data to the relevant block of the NAND.

In order to copy data from one location in the NAND array, such as a first erase block of a first die, to another location in the NAND array, such as a first erase block of a second die, during flash management operations, the data may be transferred to the controller prior to programming to another location in the NAND array. In other words, the flash management operation may be termed as copy through controller (CTC). In another embodiment, data may be copied from a first type of memory cell that includes SLC, MLC, TLC, and QLC to a second type of memory cell that includes SLC, MLC, TLC, and QLC. Other iterations of memory cells are contemplated and may be applicable to the disclosed embodiments. When copying data from one location in the NAND array to another location in the NAND array through the controller, the bit errors may be corrected and the bit errors may not be propagated to the copied data programmed to the another location in the NAND array.

Figure 3:
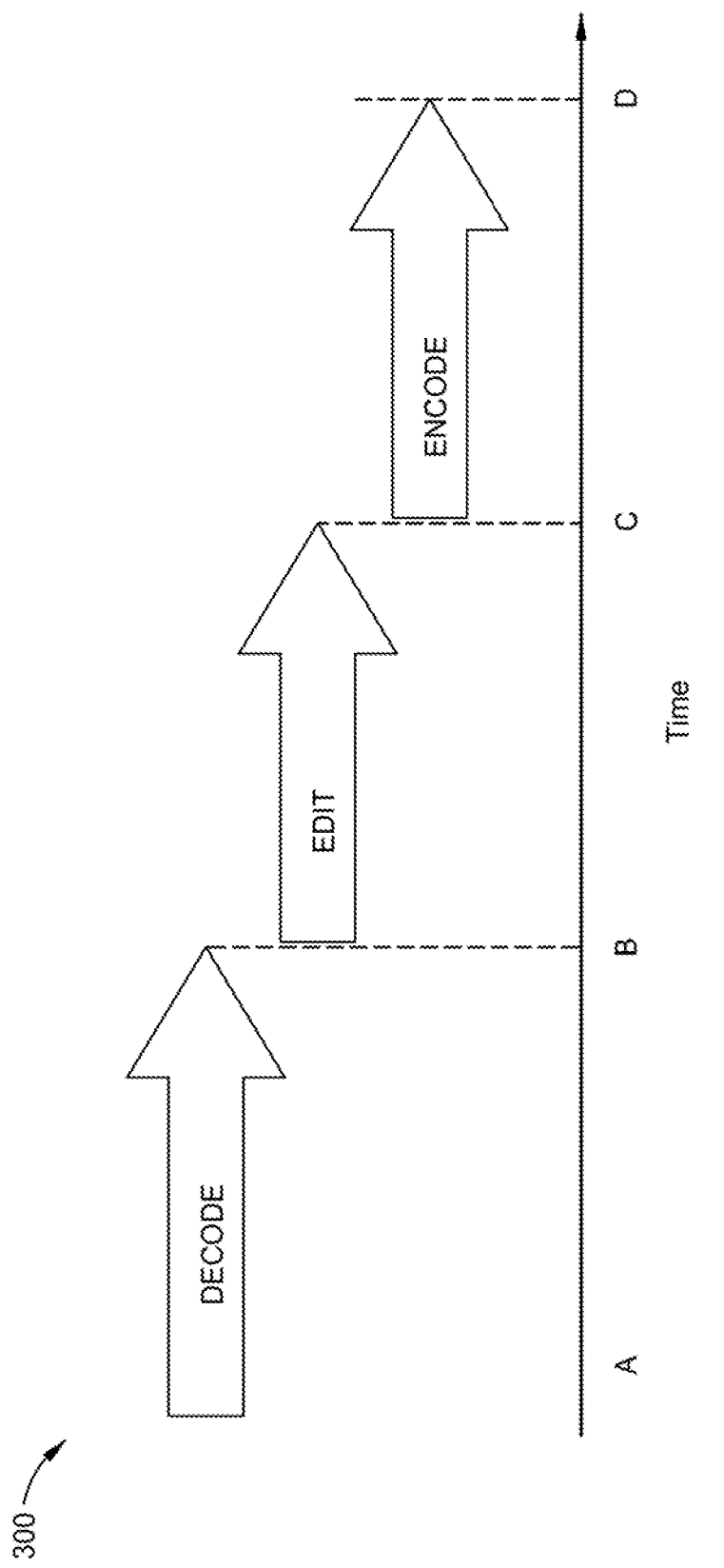
FIG. 3 depicts a graph describing the re-encoding process with respect to time, according to disclosed embodiments.

FIG. 3 is a graph describing the re-encoding process with respect to time, according to disclosed embodiments. At time A, the flash management operations of the controller of the storage device begin. The relevant one or more codewords are transferred from one or more blocks of the NAND to the controller. The one or more codewords are decoded by the decoder of the controller.

At time B, the one or more codewords are successfully decoded, and the controller begins to edit the one or more codewords. Editing the one or more codewords may include garbage collection operations, memory scrubbing, and the like. The editing operation may affect the metadata, but not the host data. Furthermore, the position of the metadata in each codeword may be fixed.

After the one or more codewords are successfully edited, the plurality of parity data are re-encoded to the codeword at time C. When encoding the plurality of parity data, to the one or more codewords, each set of parity data of the one or more codewords is encoded utilizing a diagonal or a semi-diagonal parity check matrix, such as the diagonal parity check matrix illustrated in FIG. 2. In the diagonal or the semi-diagonal parity check matrix, each set of parity equations are dependent on the previous set of parity equations.

Figure 4:
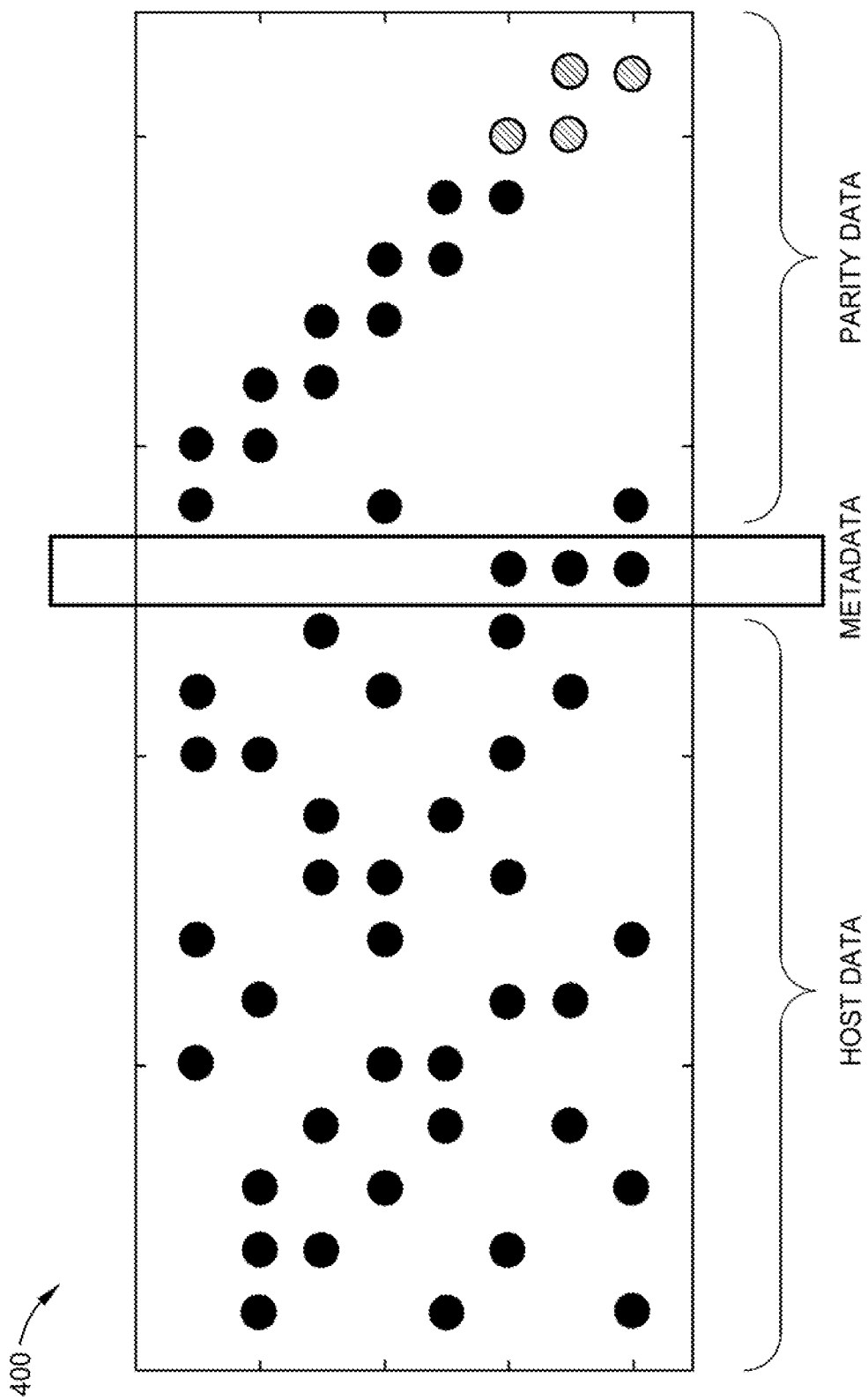
FIG. 4 depicts a graph illustrating calculating parity bits for the changed portion of the metadata, according to disclosed embodiments.

FIG. 4 is a graph illustrating calculating parity bits for the changed portion of the metadata, according to disclosed embodiments. Aspects of FIG. 4 may be similar to the embodiment described in FIG. 2. Aspects of the LDPC code may be designed to include a fast encode section to correspond to the same equations that the last parity variables are connected. For example, the fast encode section may be affected by the location of the metadata shown in FIG. 4.

The LDPC code may edit the last bits of the metadata, such that the change to the parity bit matrix is minimized. Thus, when the one or more codewords are re-encoded, most of the parity bits in the matrix are unchanged and only the changed parity bits in the matrix may need to be re-encoded. For example, because the parity equations are connected to the last parity variables, most of the parity bits may be unchanged when editing the metadata. The modified portion of the parity check data may include the trailing portion of the parity check data. In FIG. 4, the parity bits with a black outline may be the only parity bits that need to be recalculated out of the plurality of parity bits. Furthermore, the encoding process may only encode the portion of the stored data related to the trailing portion of the parity check data. By having fewer changed parity bits, the editing process and the encoding process may be faster.

Figure 5:
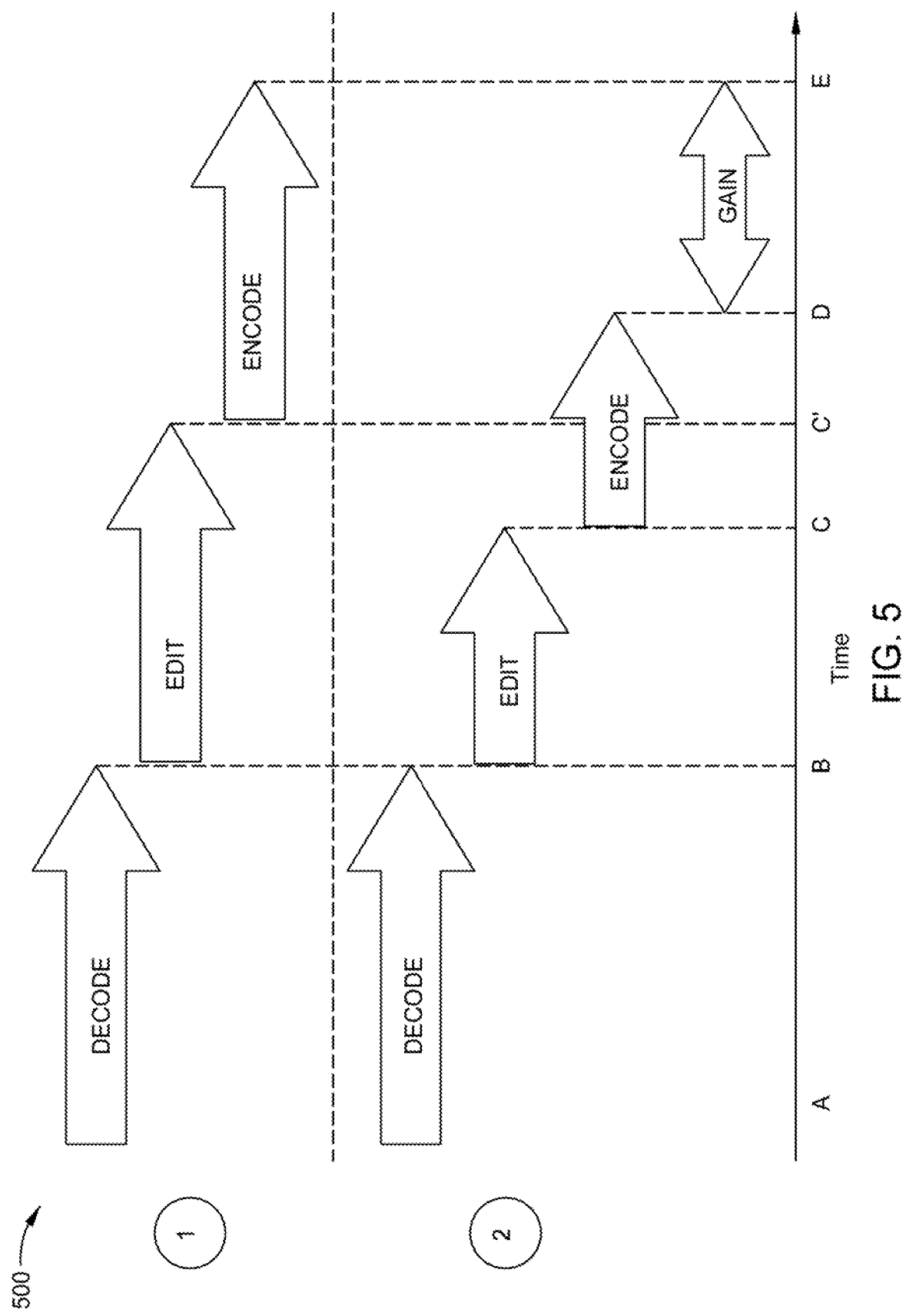
FIG. 5 depicts a graph describing the improved re-encoding process with respect to time, according to disclosed embodiments.

FIG. 5 is a graph describing the improved re-encoding process with respect to time, according to disclosed embodiments. Aspects of FIG. 4 may be applicable to the embodiments described in FIG. 5. Furthermore, flow 1 may represent the embodiments described in FIG. 3. Flow 2 may represent the embodiments described in FIG. 4.

Regarding flow 2, at time A, the flash management operations of the controller of the storage device begin. The relevant one or more codewords are transferred from one or more blocks of the NAND to the controller. In one embodiment, the one or more blocks are from SLC memory. The one or more codewords are decoded by the decoder of the controller.

Regarding flow 2, at time B, the one or more codewords are successfully decoded, and the controller begins to edit the one or more codewords. Editing the one or more codewords may include garbage collection operations, memory scrubbing, and the like. The editing operation may affect the metadata, but not the host data. Furthermore, the position of the metadata in each codeword may be fixed. Because the fast encode section of the LDPC code affects the parity equations relating to the last parity variables, the editing process of the one or more codewords finishes at time C. The flow 2 editing process finishes prior to the flow 1 editing process, where the flow 1 editing process completes at time C'.

Regarding flow 2, at time C, the portion of the stored data related to the trailing portion of the parity check data is encoded. Because the majority of the parity bits remain unchanged, the encoding process may only affect the changed or updated parity bits. As a result of few parity bits to encode, the encoding process finishes at time D. In various embodiments, the encoded one or more codewords may be programmed to the SLC memory, the MLC memory, the TLC memory, or the QLC memory. In one embodiment, the encoding time may be reduced by about 50% to about 75%. While flow 2 is finished at time D, the flow 1 is still encoding the plurality of parity bits. Thus, the gain of flow 2 may be the time between time D and time E.

Figure 6:
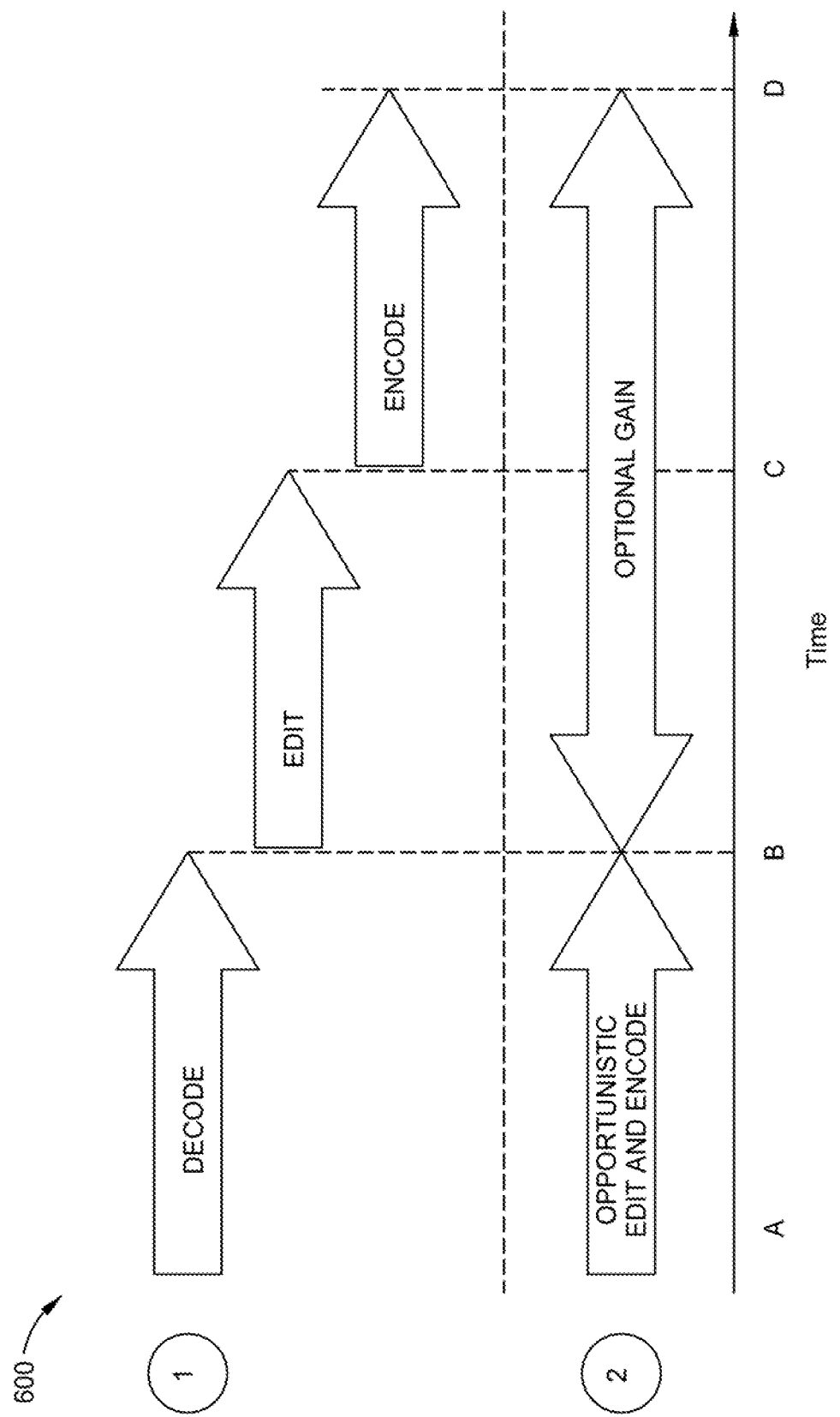
FIG. 6 depicts a graph describing the opportunistic re-encoding process with respect to time, according to disclosed embodiments.

FIG. 6 is a graph describing the opportunistic re-encoding process with respect to time, according to disclosed embodiments. Aspects of FIG. 4 may be applicable to the embodiments described in FIG. 6. Furthermore, flow 1 may represent the embodiments described in FIG. 3. Flow 2 describes the opportunistic re-encoding process of a flash management operation, such as folding.

At time A, the flash management operations of the controller of the storage device begin. The relevant one or more codewords are transferred from one or more blocks of the NAND to the controller. In one embodiment, the one or more blocks are from SLC memory. Referring to flow 1, the one or more codewords are decoded by the decoder of the controller. Referring to flow 2, when the one or more codewords are decoded, the controller performs the editing process and the encoding process in parallel to the decoding. Because programs to the SLC memory usually show little to no flipped bit counts (FBC), programs to the SLC memory generally results in no errors. Thus, decoding of the data may not be needed.

Therefore, the opportunistic editing and encoding process, where the data is edited first and encoded second, and the decoding process may begin at time A, concurrently. If an error or a flipped bit is found during the decoding process of flow 1, the opportunistic flow 2 is stopped, and the flow 1 process is continued. During flow 2, the LDPC code may edit the last bits of the metadata, such that the change to the parity bits are minimized. Thus, when the one or more codewords are re-encoded, most of the parity bits are unchanged and only the changed parity bits may need to be re-encoded. The potential time gain if no errors are found during the decode process of flow 1 by utilizing the opportunistic parallel edit and encode process is the time from about time B to about time D. In one embodiment, the encoding operation latency may be avoided as the encoding operation is performed in parallel to the decoding operation.

Figure 7:
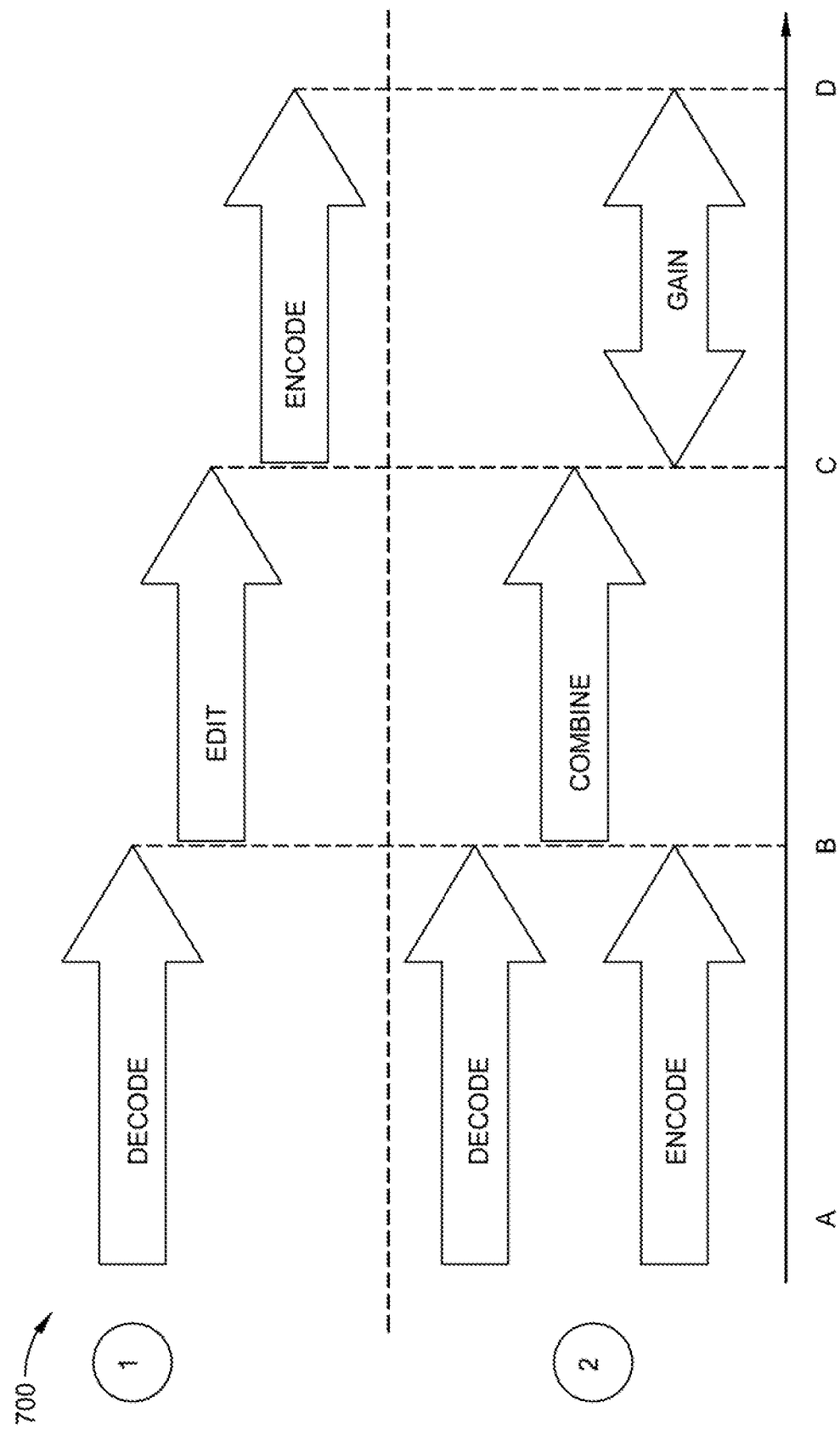
FIG. 7 depicts a graph describing the improved re-encoding process utilizing parallel operations with respect to time, according to disclosed embodiments.

FIG. 7 is a graph describing the improved re-encoding process utilizing parallel decode and encode operations with respect to time, according to disclosed embodiments. Aspects of FIG. 4 may be applicable to the embodiments described in FIG. 7. Furthermore, flow 1 may represent the embodiments described in FIG. 3. Flow 2 describes the parallel encoding and decoding process of a flash management operation.

Regarding flow 2, at time A, the flash management operations of the controller of the storage device begin. The relevant one or more codewords are transferred from one or more blocks of the NAND to the controller. In one embodiment, the one or more blocks are from SLC memory. The LDPC code may edit the last bits of the metadata, such that the change to the parity bits are minimized. Thus, when the one or more codewords are re-encoded, most of the parity bits in the matrix are unchanged and only the changed parity bits may need to be re-encoded. As the controller decodes the one or more codewords, the controller utilizes the linearity property of the LDPC to combine two or more LDPC codewords to form a legal codeword. The controller may generate a subset of the plurality of legal codewords, where each legal codeword may represent a single bit change. For example, if 8 bits are changed, then the controller may generate a subset of 8legal codewords, where each legal codeword reflects one of the 8 bits changed. The subset of 8 legal codewords may each be encoding parity candidates. Each of the subsets of the plurality of legal codewords is calculated using a plurality of versions of the parity check matrix data.

Regarding flow 2, at time B, both the decoding of the one or more codewords and the generation of the subset of the plurality of codewords are completed. At time B, the decoded codeword and each of the encoding parity candidates are combined. In one embodiment, two or more parity candidates may be selected and combined. For example, with 8 encoding parity candidates, there are about 256 combinations of the combined decoded codeword and encoding parity candidate. From the about 256 combinations, the one or more encoding parity candidates that includes a coefficient of one that reflects the change from the original data is combined with the original decoded party data using an XOR function due to the linearity property of the LDPC. The resulting XOR parity data is the encoded parity data of the relevant parts (i.e., the edited bits of data). The potential time gain by utilizing the parallel decode and encode operations is the time from about time C to about time D. In one embodiment, the encoding operation latency may be avoided as the encoding operation is performed in parallel to the decoding operation.

Figure 8:
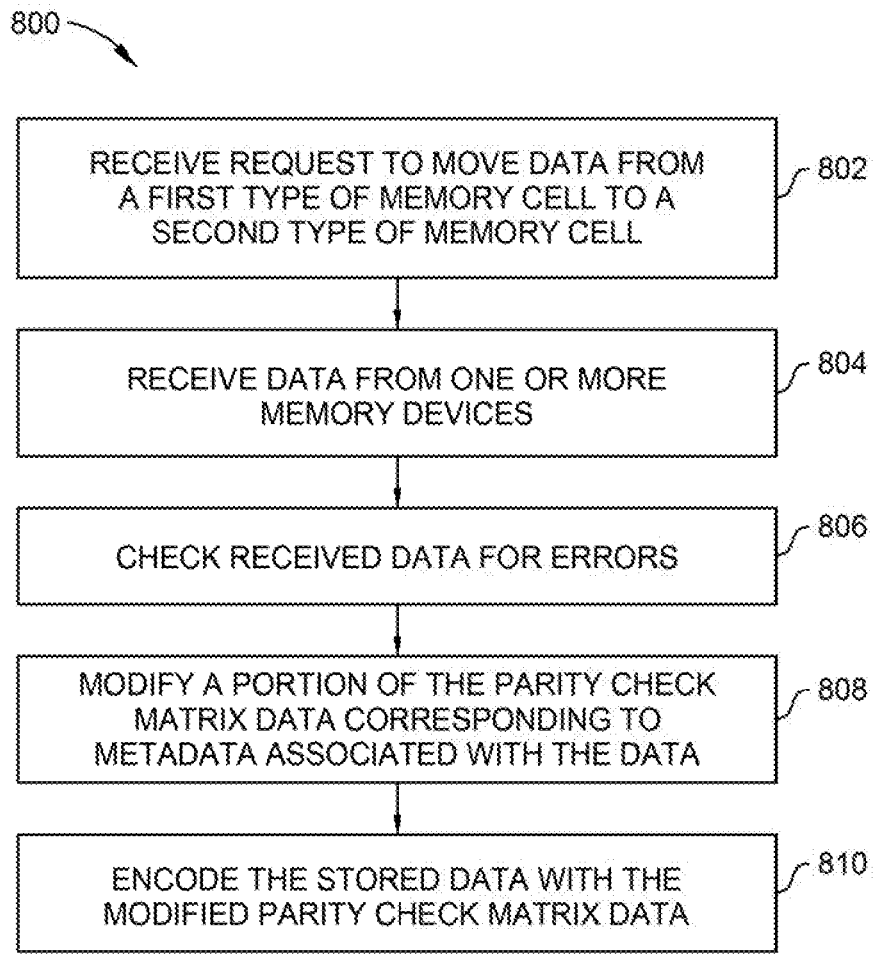
FIG. 8 depicts a method for encoding data, according to disclosed embodiments.

FIG. 8 is a method for encoding data, according to disclosed embodiments. At block 802, the controller, such as the controller 108 of FIG. 1, receives a request to move data from a first type of memory cell to a second type of memory cell. In one embodiment, the first type of memory cell may be either a SLC memory, MLC memory, TLC memory, TLC memory, or the like. The second type of memory may be either a SLC memory, MLC memory, TLC memory, TLC memory, or the like.

At block 804, the controller receives data from the one or more memory devices, where the one or memory devices may be a SLC memory, MLC memory, TLC memory, TLC memory, or the like. When the controller receives the data, the controller begins the decode process by checking the received data for errors at block 806.

At block 808, the controller modifies a portion of the parity check matrix data with updated data. In one embodiment, the modified portion of the parity check matrix data is the trailing portion of the parity check data. At block 810, the controller encodes the stored data with the modified parity check matrix data.

In one embodiment, the modified portion of the parity check matrix data is encoded by a process described in FIG. 5. In another embodiment, the editing and encoding of the parity check matrix data may be completed concurrently while the controller is decoding the data by a process described in FIG. 6. In yet another embodiment, the decoding and encoding of the parity check matrix data may be completed in parallel when no errors are found by a process described in FIG. 7. When decoding and encoding the parity check matrix data in parallel, a plurality of versions of parity check matrix data is calculated for each bit changed in the modified parity check matrix data. The controller selects at least one of the plurality of versions of parity check matrix data versions and updates the parity check matrix data with the selected one of the plurality of check matrix data versions. The update of the parity check matrix data may include the XOR of the parity check matrix data with the selected one of the plurality of versions of parity check matrix data. In one embodiment, the selected versions of parity check matrix data includes two or more versions of the plurality of versions of parity check matrix data.

By implementing a more agile copy through the controller with an editing process, the storage device may have improved performance, greater power savings during operation, and reduced firmware complexity.

In one embodiment, a data storage device is disclosed, including one or more memory devices, and a controller configured to perform a method for encoding data. In embodiments, the method includes receiving data from the one or more memory devices, the data comprising parity check matrix data, and stored data, modifying a portion of the parity check matrix data corresponding to metadata associated with the data, and encoding the stored data with the modified parity check matrix data.

The method that includes modifying the portion of the parity check data includes modifying a trailing portion of the parity check data. The method that includes encoding the stored data includes encoding only the portion of the stored data related to the trailing portion of the parity check data. The method further including receiving a request to move the data from a first type of memory cell of the one or more memory devices to a second type of memory cell of the one or more memory devices, checking the data for errors, and decoding and encoding the data in parallel when no errors are found. The first type of memory cell is one of a single layer cell (SLC), multi-layer cell (MLC), a tri-layer cell (TLC), and a quad layer cell (QLC). The second type of memory cell is one of a single layer cell (SLC), multi-layer cell (MLC), a tri-layer cell (TLC), and a quad layer cell (QLC). The method that includes modifying the parity check matrix data includes calculating a plurality of versions of the parity check matrix data, selecting at least one of the plurality of versions, and updating the parity check matrix data with the selected one of the plurality of versions. Each one of the plurality represents a version of the parity check matrix data with a different single bit modified.

In another embodiment, a controller for a data storage device is disclosed, including an I/O to one or more memory devices, and a processor configured to execute a method for encoding data. In embodiments the method includes receiving a request to move a portion of data, the portion of data comprising data and metadata comprising a first variable and a last variable, retrieving the portion of data, modifying the last variable, and writing the portion of data to the one or more memory devices.

The method further includes encoding the data with the modified last variable. The first variable and last variable includes parity bits. The method further includes generating a base of codewords for the last variable comprising a plurality of codewords representing at least two variants of the modified last variable and choosing at least two of the at least two variants based on the modifying of the last variable. The method further includes combining the at least two variants. The method that includes the combining includes combining using an exclusive-OR function. The method further includes error checking the portion of data, and upon a showing of no errors, performing at least a portion of an encoding and a decoding in parallel. The method further includes retrieving the portion of data from a single-layer cell of the one or more memory devices.

In another embodiment, a system for storing data is disclosed, the system, including one or more memory means, and a controller means configured to carry out a method for encoding data. In embodiments, the method includes reading a section of data from the one or more memory means, wherein the section of data comprises metadata and data, the metadata comprising a beginning and an end, modifying a portion of the metadata contiguous with the end of the metadata, and writing the section of data to the one or more memory means.

The method further includes encoding the data of the section of data with the modified portion of the metadata. The method further includes decoding the section of data upon reading from at least one single-layer cells of the one or more memory means and encoding the section of data with the modified portion of the metadata, in parallel with the decoding. The method further includes generating a plurality of codewords, each of the plurality of codewords corresponding to a one-bit modified version of the portion of the metadata, editing the data of the section of data, determining from the editing, a subset of the plurality of codewords, and combining the subset of the plurality of codewords. The modifying includes combining the subset of the plurality of codewords.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
one or more memory devices; and
a controller configured to perform a method for encoding data, the method comprising:
receiving data from the one or more memory devices, the data comprising parity check matrix data, and stored data;
modifying a portion of the parity check matrix data corresponding to metadata associated with the data; and
encoding the stored data with the modified parity check matrix data.

2. The data storage device of claim 1, wherein the modifying the portion of the parity check data comprises modifying a trailing portion of the parity check data.

3. The data storage device of claim 2, wherein the encoding the stored data comprises encoding only the portion of the stored data related to the trailing portion of the parity check data.

4. The data storage device of claim 1, the method further comprising:
receiving a request to move the data from a first type of memory cell of the one or more memory devices to a second type of memory cell of the one or more memory devices;
checking the data for errors; and
decoding and encoding the data in parallel when no errors are found.

5. The data storage device of claim 4, the method further comprising wherein the first type of memory cell is one of a single layer cell (SLC), multi-layer cell (MLC), a tri-layer cell (TLC), and a quad layer cell (QLC).

6. The data storage device of claim 5, wherein the second type of memory cell is one of a single layer cell (SLC), multi-layer cell (MLC), a tri-layer cell (TLC), and a quad layer cell (QLC).

7. The data storage device of claim 2, wherein modifying the parity check matrix data comprises:
calculating a plurality of versions of the parity check matrix data;
selecting at least one of the plurality of versions; and
updating the parity check matrix data with the selected one of the plurality of versions.

8. The data storage device of claim 7, wherein each one of the plurality represents a version of the parity check matrix data with a different single bit modified.

9. A controller for a data storage device, comprising:
an I/O to one or more memory devices; and
a processor configured to execute a method for encoding data, the method comprising:
receiving a request to move a portion of data, the portion of data comprising data and metadata comprising a first variable and a last variable;
retrieving the portion of data;
modifying the last variable, wherein modifying the last variable comprises:
modifying a portion of a parity check matrix corresponding to the last variable, wherein the parity check matrix comprises a plurality of parity bits; and
encoding the modified portion of the parity check matrix corresponding to the last variable; and
writing the portion of data to the one or more memory devices.

10. The controller of claim 9, the method further comprising encoding the data with the modified last variable.

11. The controller of claim 10, wherein the first variable and last variable comprise parity bits.

12. A controller for a data storage device, comprising:
an I/O to one or more memory devices; and
a processor configured to execute a method for encoding data, the method comprising:
receiving a request to move a portion of data, the portion of data comprising data and metadata comprising a first variable and a last variable;
retrieving the portion of data;
modifying the last variable;
generating a base of codewords for the last variable comprising a plurality of codewords representing at least two variants of the modified last variable;
choosing at least two of the at least two variants based on the modifying of the last variable; and
writing the portion of data to the one or more memory devices.

13. The controller of claim 12, the method further comprising combining the at least two variants.

14. The controller of claim 13, wherein the combining comprises combining using an exclusive-OR function.

15. A controller for a data storage device, comprising:
an I/O to one or more memory devices; and
a processor configured to execute a method for encoding data, the method comprising:
receiving a request to move a portion of data, the portion of data comprising data and metadata comprising a first variable and a last variable;
retrieving the portion of data;
modifying the last variable;
writing the portion of data to the one or more memory devices;
error checking the portion of data;
and upon a showing of no errors, performing at least a portion of an encoding and a decoding in parallel.

16. The controller of claim 15, the method further comprising retrieving the portion of data from a single-layer cell of the one or more memory devices.

17. A system for storing data, comprising:
one or more memory means; and
a controller coupled to the one or more memory means, the controller configured to carry out a method for encoding data, the method comprising:
reading a section of data from the one or more memory means, wherein the section of data comprises metadata and data, the metadata comprising a beginning and an end;
modifying a portion of the metadata contiguous with the end of the metadata; and
writing the section of data to the one or more memory means.

18. The system of claim 17, the method further comprising encoding the data of the section of data with the modified portion of the metadata.

19. The system of claim 17, the method further comprising:
decoding the section of data upon reading from at least one single-layer cells of the one or more memory means; and
encoding the section of data with the modified portion of the metadata, in parallel with the decoding.

20. The system of claim 17, the method further comprising:
generating a plurality of codewords, each of the plurality of codewords corresponding to a one-bit modified version of the portion of the metadata;
editing the data of the section of data;
determining from the editing, a subset of the plurality of codewords; and
combining the subset of the plurality of codewords;
wherein the modifying comprises replacing the portion of the metadata with the combined subset of the plurality of codewords.

* * * * *